United States Patent [19]

Mooney et al.

[11] Patent Number: 5,068,695
[45] Date of Patent: Nov. 26, 1991

[54] LOW DISLOCATION DENSITY SEMICONDUCTOR DEVICE

[75] Inventors: John B. Mooney, San Jose; Arden Sher, San Carlos, both of Calif.

[73] Assignee: SRI International, Menlo Park, Calif.

[21] Appl. No.: 506,046

[22] Filed: Apr. 9, 1990

Related U.S. Application Data

[62] Division of Ser. No. 187,939, Apr. 29, 1988, Pat. No. 4,916,088.

[51] Int. Cl.$^5$ .................. H01L 29/161; H01L 29/205
[52] U.S. Cl. .......................................... 357/16; 357/4; 357/61; 357/63; 357/30; 437/976; 437/987
[58] Field of Search ................ 357/16, 30 F, 30 B, 357/30 D, 30 E, 30 N, 30 P, 61, 63, 4, 4 SL, 30 J, 30 E; 148/DIG. 72, DIG. 66, DIG. 97; 437/131, 132, 133, 976, 987

[56] References Cited

U.S. PATENT DOCUMENTS

| | | | |
|---|---|---|---|
| 3,492,175 | 1/1970 | Conrad et al. | 437/81 |
| 4,255,211 | 3/1981 | Fraas | 136/249 |
| 4,366,334 | 12/1982 | Cremoux et al. | 357/30 E |
| 4,370,510 | 1/1983 | Stirn | 357/30 J |
| 4,568,792 | 2/1986 | Mooney et al. | 136/260 |
| 4,575,742 | 3/1986 | Kohashi et al. | 357/16 |
| 4,611,388 | 9/1986 | Pande | 436/133 |
| 4,659,401 | 4/1987 | Reif et al. | 437/105 |
| 4,670,176 | 6/1987 | Morioka et al. | 357/63 |
| 4,697,202 | 9/1987 | Sher | 357/63 |
| 4,734,514 | 3/1988 | Melas et al. | 556/70 |
| 4,740,606 | 4/1988 | Melas | 556/1 |
| 4,775,639 | 10/1988 | Yoshida | 148/DIG. 66 |
| 4,806,996 | 2/1989 | Luryi | 357/16 |
| 4,865,655 | 9/1989 | Fujita et al. | 148/DIG. 72 |
| 4,916,088 | 4/1990 | Mooney et al. | 148/DIG. 72 |

FOREIGN PATENT DOCUMENTS

| | | | |
|---|---|---|---|
| 59-182582 | 10/1984 | Japan | 357/17 |
| 63-217672 | 9/1988 | Japan | 357/51 |

OTHER PUBLICATIONS

"Intermetallic Semiconductor Buffered Substrate", Research Disclosure, No. 270, 10/1986.

Primary Examiner—Rolf Hille
Assistant Examiner—Minhloan Tran
Attorney, Agent, or Firm—Lowe, Price, LeBlanc & Becker

[57] ABSTRACT

A low dislocation density semiconductor device includes a first semiconductor layer of a III-V or II-VI semiconductor compound and alloying atoms on a nonmetal substrate. The semiconductor compound usually has a large dislocation density. A predetermined position of the alloying atoms in the compound lattice structure can substantially reduce the compound dislocation density. Energy is applied to the alloying atoms so they are at the predetermined positions. The number of alloying atoms causes the semiconductor compound solubility limit to be exceeded. The layer is formed on a substrate of the III-V or II-VI semiconductor, such as gallium arsenide or another semiconductor, such as silicon or on an insulator such as sapphire. In the latter cases, the layer is formed on an intermediate layer having a lattice constant between that of the substrate and semiconductor compound. A second layer is epitaxially deposited on the first layer so both layers have virtually the same lattice constant and dislocation density. The alloying atoms are deposited by different energy assist methods, e.g. by an ion beam that irradiates the substrate, or by an energy assisted organometallic chemical vapor deposition process. The energy assist can be by ionization or optical irradiation causing topical heating of surface atoms deposited by the OMCVD process, without heating of the substrate or the underlying atoms. If the ion beam process is employed, the substrate is annealed such that the alloying atoms move from initial random locations thereof in the compound lattice to the predetermined locations.

29 Claims, 2 Drawing Sheets

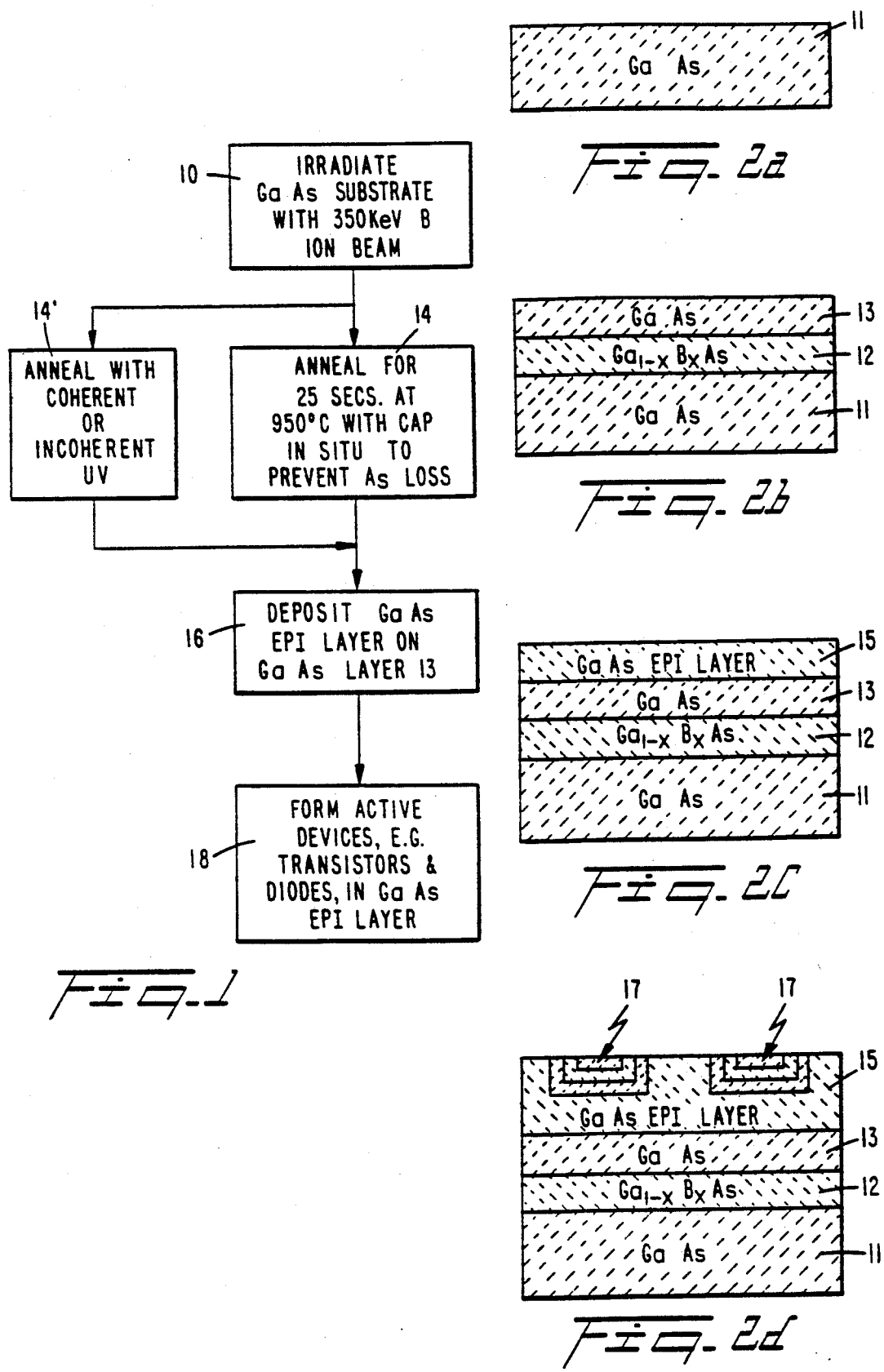

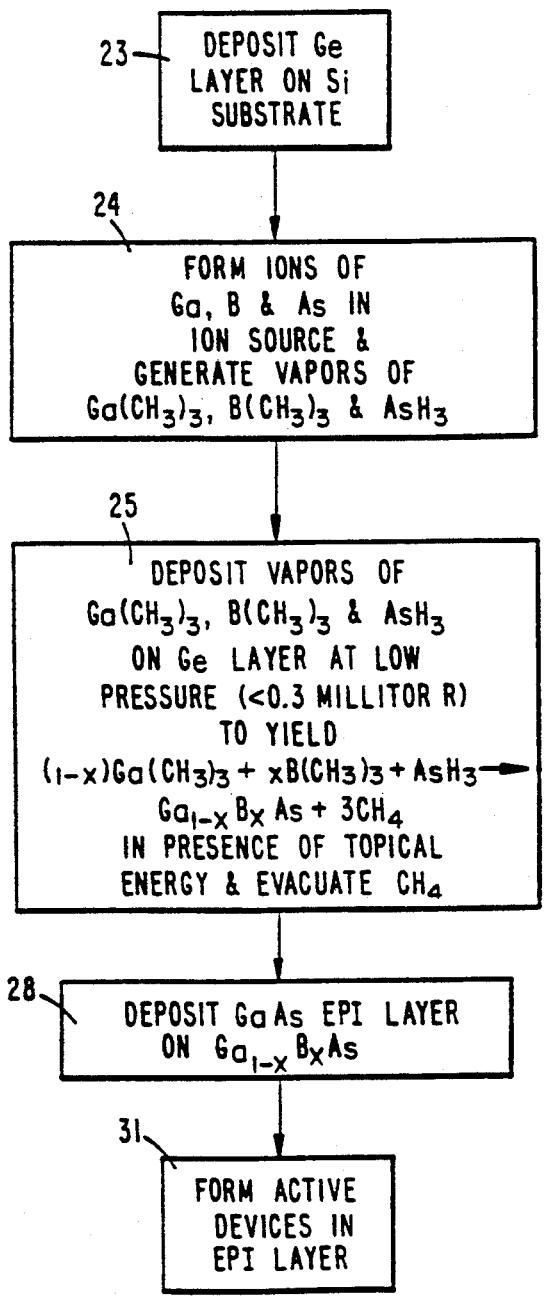
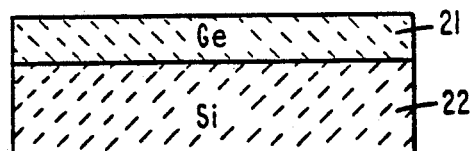
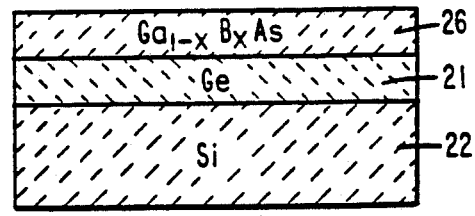
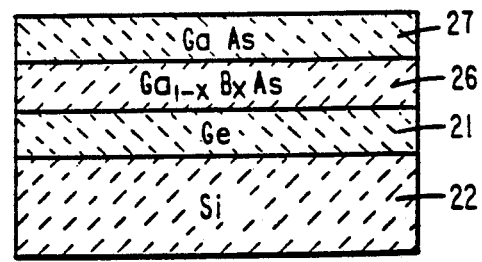
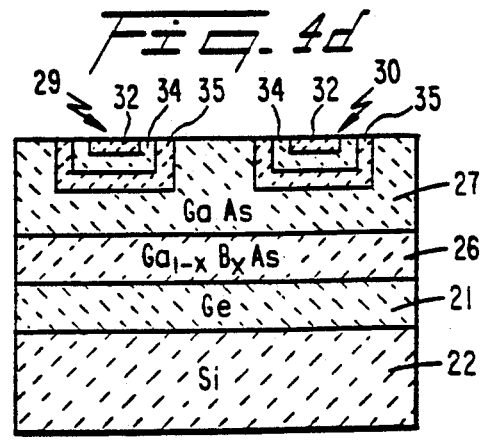

LOW DISLOCATION DENSITY SEMICONDUCTOR DEVICE

This application is a division of application Ser. No. 07/187,939, filed Apr. 29, 1988, now U.S. Pat. No. 4,916,088.

FIELD OF INVENTION

The present invention relates generally to low dislocation density semiconductor devices and more particularly to a semiconductor having a first layer of a normally high dislocation density semiconductor compound and alloying atoms located in the semiconductor compound lattice structure to reduce dislocation density of the semiconductor compound, in combination with an epitaxial layer of the compound.

BACKGROUND ART

It is known that dislocation density of semiconductor compounds of columns III–V and II–VI of the periodic chart can be reduced by proper introduction of alloying atoms into the compounds. In Sher U.S. Pat. No. 4,697,202 and Mooney et al U.S. Pat. No. 4,568,795 it is indicated that the dislocation density of III–V and II–VI semiconductor compounds can be reduced by alloying such semiconductors with isoelectronic impurity atoms forming bond lengths with the semiconductor atoms that are less than the bond lengths between the atoms of the semiconductor. It is also known to add indium as an isoelectronic impurity for gallium arsenide dislocation density reduction. The indium is added to a melt during gallium arsenide crystal growth. The indium-arsenide bond is longer than that of the gallium arsenide whereby indium alloying of gallium arsenide is apparently by a mechanism different from that relied on in the aforementioned patents. The present invention is applicable to both long and short bond length alloying atoms.

The conventional method of growing semiconductors having dislocation density reducing alloying atoms in the semiconductor structure is by melt techniques, such as modified Bridgeman and Czochralski techniques. These prior art techniques generally limit the number of the alloying atoms to relatively low values such that the solubility limit of the host semiconductor compound cannot be exceeded. This value is insufficient to eliminate dislocations totally. For example, these conventional melt techniques are generally able to introduce a maximum of about 0.09 atom percent boron into gallium arsenide, to form $Ga_{.9991}B_{.0009}As$. In the conventional methods, for j boron concentrations in GaAs above 0.09 atom percent solubility limit, constitutional super cooling leads to striations and eventually polycrystallinity. It was found that in the region between striations dislocation density was relatively low. While the 0.09 atomic percent introduction of boron results in a significant dislocation density reduction, greater dislocation density reduction can be achieved with larger percentages of boron in gallium arsenide. The same is true for other alloying atoms that reduce semiconductor compound dislocation density. It would be desirable to introduce a number of alloying atoms such that the semiconductor compound is in a metastable state, exceeding the solubility limit thereof, and the alloying atoms are in a super-saturated state in the semiconductor compound. For example, it would be desirable to alloy gallium arsenide with boron so that there is a 5 atomic percent introduction of boron into the gallium, to produce $Ga_{.95}B_{.05}As$.

Reduction and elimination of dislocations in gallium arsenide have been sought for many years. If the high dislocation density inherent in gallium arsenide could be materially reduced over large volumes, the known advantages of gallium arsenide relating to high speed operation and radiation withstanding properties could finally be achieved. Hence, it is highly desirable to provide a virtually dislocation-free gallium arsenide carrier for active semiconductor devices, a result which could be achieved by introducing an epitaxial layer of gallium arsenide super-saturated with boron or nitrogen on a conventional substrate, e.g., of bulk gallium arsenide, silicon or sapphire. If the boron or nitrogen concentration in the gallium arsenide is supersaturated, the energy per unit length for dislocation formation arising mostly from long range shear strains increases in the presence of the short bond length induced increase of the elastic constants of the introduced boron or nitrogen atoms, to prevent dislocations from propagating from the substrate into the epitaxial layer. A problem, however, in introducing boron or nitrogen to a super-saturated concentration, is that the alloying atoms may affect the electric characteristics of the semiconductor devices formed in the epitaxial layer containing the alloying atoms. To obviate this problem, it is desirable to form a GaAs epitaxial layer on the epitaxial layer containing the alloying atoms. Also, great care must be exercised in depositing layers with supersaturated concentrations of the alloying atoms because of the great tendency for the alloying atoms to precipitate from the GaAs lattice structure into a conglomerated mass (inclusions).

It is, accordingly, an object of the present invention to provide a new and improved low dislocation density semiconductor devices substrates and devices.

Another object of the invention is to provide a new and improved low dislocation density semiconductor devices alloyed with atoms that reduce dislocations in the semiconductor device.

Another object of the invention is to provide a new and improved low dislocation density devices wherein dislocation removing alloying atoms are above the solubility limit of a semiconductor compound.

Another object of the invention is to provide a new and gallium semiconductor alloy with boron or nitrogen to an extent that the boron or nitrogen exceeds the solubility limit of the gallium arsenide and is supersaturated therein.

THE INVENTION

In the present invention, a low dislocation density semiconductor device is formed by forming a semiconductor layer consisting essentially of a III–V or II–VI semiconductor compound and alloying atoms on a nonmetal substrate. The III–V or II–VI semiconductor compound, when formed as a layer on the substrate, usually has a relatively large dislocation density for one reason or another. For example, the substrate may have a high dislocation density (as in the case of gallium arsenide) resulting in the layer usually having a similar large dislocation density, or the formed layer may have a lattice constant materially different from the lattice constant of the substrate or an underlying layer, resulting in strains in the layer that lead to high dislocation density substrate. The alloying atoms are of a type such that a predetermined position of atoms thereof in the III–V or II–VI semiconductor compound lattice can substantially reduce the dislocation density of the III-V or II-VI semiconductor compound layer. Such alloying atoms are of the type disclosed in the aforementioned Sher and Mooney et al patents or by the introduction of indium, as discussed supra.

In accordance with one aspect of the invention, energy is applied to the alloying atoms such that they are at the predetermined positions thereof in the lattice. Preferably, the number of alloy atoms is such that the semiconductor is in approximately a metastable state, i.e., above the solubility limit of the semiconductor compound such that the alloying atoms are supersaturated in the III-V or II-VI semiconductor compound.

In one embodiment of the invention, the alloying atoms are deposited in the substrate by an ion beam having sufficient energy to cause ions in the beam to be deposited at random positions in the substrate lattice structure, several atomic layers below the substrate surface. The substrate is then flash annealed causing the alloying atoms to move from the initial random locations thereof to the predetermined locations in the lattice where dislocation density is substantially reduced, without precipitating the alloying atoms.

It has been found, through actual experimentation, that irradiating a gallium arsenide bulk substrate with boron atoms causes formation of a low dislocation density $Ga_{1-x}B_xAs$ layer if the substrate is flash annealed at a temperature of about 950° C. for about 25 seconds. The resulting structure thus includes a bulk substrate consisting essentially of gallium arsenide in which is buried a $Ga_{1-x}B_xAs$ low dislocation density layer having a thickness of a few thousand atomic layers over which subsists a low dislocation GaAs layer having a thickness of several thousand atomic layers. An epitaxial GaAs layer is then grown on the GaAs layer having a thickness of several thousand atomic layers. Electronic semiconductor devices are formed in the grown low dislocation GaAs layer. Alternatively, a super lattice structure is grown on the low dislocation density GaAs layer having a thickness of several hundred to several thousand atomic layers.

In a second embodiment, the alloying atoms and III-V or II-VI semiconductor compound are deposited using low energy organometallic chemical vapor deposition techniques. The alloying atoms and semiconductor atoms are carried in first and second molecules containing organic ions. The molecules react on the substrate to form the low dislocation density alloyed layer. For example, to form $Ga_{1-x}B_xAs$ and $GaN_yAs_{1-y}$ layers, the following reactions occur:

$AsH_3 + (1-x)Ga(CH_3)_3 + xB(CH_3)_3 \rightarrow Ga_{1-x}B_x\text{-}As + 3CH_4$ $(1-y)AsH_3 + Ga(CH_3)_3 + yN(CH_3)_3 \rightarrow GaN_yAs_{1-y} + 3CH_4$ where $0<x<0.3$, $0<y<0.3$; preferably $0.01<x<0.05$ and $0.005<y<0.05$ to assure achieving boron and nitrogen supersaturation while avoiding precipitation.

To enable boron to be alloyed into the gallium arsenide at or above the gallium arsenide solubility limit energy is topically added to $Ga_{1-x}B_xAs$ or $GaN_yAs_{1-y}$ as they are deposited on the substrate by the reaction. The topically added energy can be in the form of low energy ions of the molecules involved in the reaction as derived from a cyclotron resonance device, or ions extracted from a microwave plasma by biasing the substrate, or photon (preferably ultraviolet) irradiation of the substrate. The added energy causes the alloying atoms in the upper few deposited atomic layers to be at the correct lattice sites to reduce dislocation density, without causing precipitation of the alloying atoms even though they are supersaturated in the GaAs molecules. The added energy increases the mobility of the alloying B atoms at the surface where the chemical reaction takes place enabling the B atoms to be supersaturated in the lattice at sites corresponding with Ga atoms; in the case of N atoms being alloyed with GaAs, the N atoms are supersaturated in the lattice at sites corresponding with As atoms.

The organometallic chemical vapor deposition (OMCVD) process is advantageous because it obviates the need to add alloying atoms to a substrate or a formed layer. Because of the OMCVD process boron or nitrogen atoms are deposited in the gallium arsenide lattices during formation at the location where dislocation density is minimized. This is true whether the $Ga_{1-x}B_xAs$ or $GaN_yAs_{1-y}$ layer is deposited on a GaAs substrate or on some other substrate, such as a silicon substrate on which is formed a lattice matching buffer layer of e.g., Ge, or a graded SiGe layer. The lattice matching layer is formed on a silicon layer prior to deposition of a $Ga_{1-x}B_xAs$ or $GaN_yAs_{1-y}$ layer because there is a lattice mismatch between $Ga_{1-x}B_xAs$ or $GaN_yAs_{1-y}$ and Si such that the desired dislocation density in the $Ga_{1-x}B_xAs$, $GaN_yAs_{1-y}$ and GaAs layers may not otherwise be achieved.

The OMCVD process is applicable to other hydrocarbons to produce other III-V or II-VI semiconductors with supersaturated dislocation density reducing alloying atoms. For example, to form a $Ga_{1-x}B_xAs$ or a $GaN_yAs_{1-y}$ layer, where $0<x<0.3$ and $0<y<0.3$ (preferably $0.01<x<0.05$ and $0.005<y<0.05$), the following reactions are performed in a low pressure reaction vessel on a layer of a suitable substrate in the presence of a topical energy assist step:

$(1-x)GaR' + xB(R'')_3 + As(R''')_3 \rightarrow$ $Ga_{1-x}B_xAs + 3(1-x)R'R''' + 3xR''R'''$ or $Ga(R')_3 + (1-y)As(R''')_3 + yN(R'''')_3 \rightarrow$ $GaN_yAs_{1-y} + 3(1-y)R'R''' + 3yR'R''''$ where R', and R'''' are any hydrocarbon groups of the alkyl family $C_nH_{2n-1}$, R''' is H or any hydrocarbon groups of the alkyl family $C_nH_{2n-1}$, and n is 1, 2, 3, 4 . . . (usually less than 5).

When the low energy ionization source is used to produce the ions for the organometallic molecules the chemistry remains the same as in conventional processes, but the added energy of ionization and the accelerating field assist in the epitaxy process and aid in introducing the boron or nitrogen into a metastable solution. The organometallic chemical vapor deposition process enables substrate temperatures to be relatively low, a particular advantage when $Ga_{1-x}B_xAs$ is deposited on a germanium lattice matching layer deposited on a silicon substrate. Low temperatures are desirable in such processes because of the substantial differences of the temperature coefficients of expansion and thermal conductivities of $Ga_{1-x}B_xAs$, Ge and Si. The high temperatures involved in annealing an ion implanted $Ga_{1-x}B_xAs$ layer are obviated through the use of the organometallic chemical vapor deposition (OMCVD) process. The OMCVD process also avoids the need for extreme control of temperature and magnetic fields during growth. It reduces the fragility introduced by conventional indium alloying of GaAs, which have limited the size and availability of gallium arsenide for substrates.

Photon energy, particularly in the form of coherent or incoherent ultraviolet energy, can be used for annealing after high energy ion beam irradiation, or to irradiate the substrate at the time a chemical vapor deposition process is in progress, as described supra.

BRIEF DESCRIPTION OF THE DRAWING

FIG. 1 is a flow diagram in accordance with the present invention wherein boron is implanted in gallium arsenide and annealed to form a low dislocation density $Ga_{1-x}B_xAs$ layer;

FIGS. 2a-2d are schematic side views of an electronic semiconductor device formed in accordance with the method of FIG. 1, at various stages in the construction of the device;

FIG. 3 is a flow diagram of a second embodiment of the invention wherein an electronic device is formed on an epitaxial $Ga_{1-x}B_xAs$ layer on a silicon substrate; and FIGS. 4a-4e are schematic side views of the device formed in accordance with the method of FIG. 3, at various stages in the construction of the device.

DESCRIPTION OF PREFERRED EMBODIMENTS

Reference is now made to FIGS. 1 and 2a-2d of the drawing wherein a gallium arsenide bulk substrate 11 having the usual relatively high dislocation density is irradiated during step 10 with an ion beam having an energy level of 350 kiloelectron volts and containing doubly ionized boron (B++). In the preferred embodiment, the boron ions irradiate substrate 11 until boron atoms in the substrate reach a density in the range of $2 \times 10^{19}$ to about $6.5 \times 10^{21}$ atoms per cubic centimeter of GaAs, although the preferred range is from about $10^{20}$ to $10^{21}$ atoms of boron per cubic centimeter of GaAs. The stated maximum range enables the boron to be supersaturated and precludes boron precipitation. The preferred range more positively provides these factors.

The boron ions have sufficient energy to penetrate the top several thousand atomic layers of gallium arsenide substrate 11 so that after approximately one half hour of ion bombardment, there is formed isoelectronic layer 12 containing gallium, boron and arsenic. Layer 12 is buried below layer 13 containing only gallium and arsenic. Layer 12 has a thickness of between ½ and 1 micron, i.e., a thickness of about 2,000 atomic layers. Layer 13 has a thickness of between ¼ and ½ micron, i.e. a thickness of 500 to 1,000 atomic layers.

The boron atoms in layer 12 are initially at random positions in the gallium arsenide of substrate 11. The low dislocation density effects of boron in gallium arsenide, as discussed in the aforementioned Sher patent, are attained by locating boron atoms at the correct, predetermined position as the lattice structure of layer 12 is recrystallized. To these ends, substrate 11, including layers 12 and 13, is flash annealed, as illustrated in steps 14 or 14'. A $Si_3N_4$ cap is placed above layer 13 during annealing. Rapid or flash annealing also helps to minimize arsenic out gassing from substrate 12 and enables the solubility limit of the boron vis-a-vis gallium arsenide to be exceeded to assist in minimizing dislocation density in layers 12 and 13.

During the flash annealing step, the boron atoms in layer 12 move in layer 12 to the correct positions in the gallium arsenide lattice thereof, to form $Ga_{1-x}B_xAs$ having the desired low dislocation density, where $0 < x < 0.3$ and preferably $0.01 < x < 0.05$. Layers 12 and 13 have nearly the same lattice constant and dislocation density. Flash annealing is important to prevent precipitation of boron from layer 12; in other words, flash annealing prevents the boron atoms in layer 12 from conglomerating. By flash annealing the B atoms do not have time for agglomeration but enough energy is provided for recrystallization of boron atoms in gallium lattice sites. If the boron atoms precipitate they are not at the correct lattice sites in the gallium arsenide matrix and the desired effects discussed in the Sher patent are not achieved.

In experiments actually conducted using quartz iodide infrared lamps, it was found that flash annealing for 25 seconds at 950° C., provided the greatest dislocation density reduction of layers 12 and 13 relative to that of substrate 11. If the annealing temperature is appreciably higher than 950° C., arsenic atoms boil off substrate 11 and thereby adversely affect the properties of the substrate. It has been found that if annealing is at temperatures less than 950° C. the low dislocation density attained with the 950° C. annealing does not occur.

Annealing can also be accomplished by irradiating the top atomic layers of substrate 11 containing layers 12 and 13 with ultraviolet photon energy derived from a coherent or incoherent source, i.e., from an ultraviolet laser or from an ultraviolet lamp, as indicated by step 14'. The annealing of step 14' desirably produces the same results as discussed for step 14, i.e., providing sufficient mobility to the boron atoms to locate them properly in the gallium arsenide lattice to minimize dislocation density in layers 12 and 13, without causing the boron to precipitate.

After low dislocation density layers 12 and 13 have been formed on gallium arsenide substrate 11, the thickness of low dislocation density layer 13 may be increased to enable active semiconductor devices to be formed on the low dislocation density structure. This is because layer 13 has a thickness of only ½ to ¼ micron. To these ends, using conventional growth techniques, gallium arsenide epitaxial layer 15 is deposited on layer 13 to a thickness sufficient to accommodate active semiconductor devices, such as bipolar transistors 17 that are formed in layer 15 during step 18. Because of the low dislocation density of the gallium arsenide layer containing the active electronic devices and the high electron mobility thereof, the active devices have uniform reproducible characteristics and are capable of very high speed operation.

Reference is now made to FIG. 3 and 4 of the drawing wherein there are respectively illustrated organometallic chemical vapor deposition steps for forming a device containing a low dislocation density gallium arsenide epitaxial layer 27 with high speed, active devices therein, and the device in intermediate and final forms. Gallium arsenide layer 27 is formed as an epitaxial layer on low dislocation density $Ga_{1-x}B_xAs$ layer 26, in turn formed on germanium layer 21 deposited on bulk silicon substrate 22, where x may have a value between 0.0009 and 0.3 and preferably has a value in the range of about 0.01 to 0.05; at all of these values the boron is super-saturated in the GaAs. Germanium layer 21 is deposited on silicon substrate 22 as an intermediate layer between $Ga_{1-x}B_xAs$ layer 24 and the silicon substrate to provide an approximate lattice match for the $Ga_{1-x}B_xAs$ layer. The lattice constants of $Ga_{1-x}B_xAs$ and silicon differ enough from each other such that a low dislocation density $Ga_{1-x}B_xAs$ layer may not be formed as easily on a silicon substrate without the use of the intermediate Ge layer; Ge has a lattice constant of 5.658, Si has a lattice constant of 5.431 and GaAs has a lattice constant of 5.654. Since x is preferably between 0.01 and 0.05 the lattice constant of $Ga_{1-x}B_xAs$ is about the same as Ge to promote a low dislocation density of $Ga_{1-x}B_xAs$ layer 26.

To these ends, germanium layer 21 is deposited on silicon substrate 22 during conventional deposition step 23. Then ions of Ga, B and As are formed in an ion source and vapors of $Ga(CH_3)_3$, $B(CH_3)_3$ and AsH are formed during step 24 and deposited during step 25 as $Ga_{1-x}B_xAs$ layer 26. $Ga_{1-x}B_xAs$ layer 26 is formed on Ge layer 21 in a low-pressure (not more than 0.3 torr) vacuum chamber using an energy assist low-pressure organometallic chemical vapor deposition (OMCVD) process according to the invention. The energy assist can be a low energy ion or photon assisted OMCVD process. The low energy ion assisted OMCVD process can be of the cyclotron resonance type, as disclosed by Yamada et al, *Applied Physics Letters*, Vol. 50, No. 7, Feb. 16, 1987, pp. 386-388 wherein a substrate is supplied with a bias voltage causing ions of gallium, boron and arsenic compounds to be simultaneously incident thereon while un-ionized vaporized molecules of Ga (CH$_3$)$_3$, B (CH$_3$)$_3$ and AsH$_3$ are deposited on the germanium layer. During the deposition process, the following chemical reaction occurs:

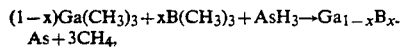

where $0<x<0.3$; preferably $0.01<x<0.05$. The reaction occurs between un-ionized and ionized molecules of $Ga(CH_3)_3$, $B(CH_3)_3$ and $AsH_3$. The ionized molecules, typically having energies between 50 and 300 eV as a result of the substrate bias, add sufficient energy to the atoms involved in the reaction at any time instant to increase the mobility thereof to achieve the supersaturated low dislocation density structure. The added energy is not sufficient, however, to affect the lattice structure of previously deposited and formed atomic layers of $Ga_{1-x}B_xAs$, Ge layer 21 or substrate 22. Therefore, the added energy only topically affects the $Ga_{1-x}B_xAs$ molecules and does not cause B atoms in the top or underlying previously deposited $Ga_{1-x}B_xAs$ atomic layers to precipitate out of the supersaturated state.

Other mechanisms can be used to topically add energy to $Ga(CH_3)_3$, $B(CH_3)_3$ and $AsH_3$ molecules during the chemical vapor deposition process to achieve the required B mobility to achieve a supersaturated B state, without B precipitation. For example, ions can be extracted from a microwave plasma by biasing a substrate in the vicinity of a source of such a plasma while vapors of $Ga(CH_3)_3$, $B(CH_3)_3$ and $AsH_3$ are directed at a surface on the substrate. The extracted ions are incident on the substrate surface with sufficient energy to increase the mobility of molecules involved in the reaction to cause B to be at the correct lattice sites to achieve reduced dislocation density. The ion energy must be sufficiently low to preclude heating of previously deposited, underlying $Ga_{1-x}B_xAs$ atomic layers, Ge layer 21 and substrate 22 to prevent B precipitation. Another alternative involves photon irradiating a surface on the substrate while the $Ga(CH_3)_3$, $B(CH_3)_3$ and $AsH_3$ molecules are incident on the surface. Preferably, the photons are in an optical ultraviolet coherent or incoherent beam that scans or blankets the surface. Ultraviolet energy is preferred because it has the energy level necessary to cause the B atoms to have the required mobility to assume the correct lattice site while preventing precipitation.

Methane (CH$_4$) formed during the reaction is evacuated from the low pressure reaction chamber. The mole values of the deposited vapors are adjusted such that x is in the above range so that layer 26 is supersaturated with boron to achieve the desired low dislocation density for layer 26.

Next, GaAs epitaxial layer 27 is formed on $Ga_{1-x}B_xAS$ layer 26 during step 28. GaAs layer 27 is formed using conventional crystal grown techniques, or by using an ion-assisted low-pressure organometallic chemical vapor process. GaAs layer 27 is deposited on $Ga_{1-x}B_xAs$ layer 26 because active electronic semiconductor devices have better performance characteristics in GaAs layer 27 than in $Ga_{1-x}B_xAs$ layer 26. If an ion-assisted organometallic chemical vapor deposition process is used for GaAs layer 27, such a deposition process is also performed in a low pressure reaction chamber at a pressure of less than 0.3 millitorr by formin ions simultaneously in one or more ion sources to generate at least partially ionized vapors of $Ga(CH_3)_3$ and $AsH_3$. The reaction is:

Again, methane produced by the reaction is evacuated from the reaction chamber. Then, active circuit elements are deposited in GaAs layer 27 using conventional diffusion or implantation techniques. In particular, bipolar transistor devices 29 and 30 are formed during step 31 by diffusing p and n type dopants into layer 27 to form emitters 32, bases 34 and collectors 35. Other types of active devices, such as field effect devices can be formed in layer 27. Appropriate connections between the various active devices are formed using conventional techniques to form desired circuit configurations.

To reduce dislocation density further in a gallium arsenide layer containing the active devices, a superlattice structure of alternate $Ga_{1-x}B_xAs$ and GaAs layers is formed such that there are multiple sets of alternating $Ga_{1-x}B_xAs$ and GaAs layers. The alternate layers of $Ga_{1-x}B_xAs$ and GaAs provide strain layers to virtually terminate dislocations. The alternate $Ga_{1-x}B_xAs$ and GaAs super lattice layers are preferably deposited utilizing the previously described ion assisted organometallic chemical vapor deposition process.

To reduce dislocation density further in $Ga_{1-x}B_xAs$ layer 27, layer 21 is formed as a graded $Si_yGe_{1-y}$ layer, where y varies from slightly more than 0 to 1; the values of y approximating 1 are on and adjacent silicon substrate 22 while the values of y close to 0 are at or in very close proximity with $Ga_{1-x}B_xAs$ layer 26. The graded $Si_yGe_{1-y}$ layer is formed in the usual manner by varying percentages of silicon and germanium during the deposition process for the $Si_yGe_{1-y}$ layer. While a lattice mismatch occurs all the way through the graded $Si_y Ge_{1-y}$ layer, at the Ge rich side of the graded layer there are fewer dislocations than if a pure germanium layer having the same thickness were deposited on silicon substrate 22. Because of the fewer dislocations in the graded $Si_y Ge_{1-y}$ layer at the Ge-rich side, there are fewer dislocations in the $Ga_{1-x}B_xAs$ layer at its interface with the graded layer and fewer dislocations in the GaAs layer. By using the $Ga_{1-x}B_xAs/GaAs$ super-lattice technique, dislocation density in the GaAs layer containing the active semiconductor devices is virtually zero.

Alternative structures having low dislocation density layers containing active devices can be deposited on various substrates of, e.g., gallium arsenide, silicon or sapphire ($Al_2O_3$). Intermediate layers containing alloying atoms formulated as $Ga_{1-x}B_xAs$ or $GaN_zAs_{1-z}$ or intermediate layers of Ge or graded $Si_yGe_{1-y}$ an $Ga_{1-x}B_xAs$ layers can be employed. A summary of the preferred substrates, preferred intermediate layers and preferred final layers is:

(1) $GaAs/Ga_{1-x}B_xAs/GaAs$, where x is a fixed value in the range from 0.01 to 0.05 (in this notation GaAs is the substrate, $Ga_{1-x}B_xAs$ is the intermediate layer and GaAs is the device containing layer), (2) $Si/Ga_{1-x}B_xAs/GaAs$, where x is a fixed value between 0.01 and 0.05, (in this notation Si is the substrate, $Ga_{1-x}B_xAs$ is the intermediate layer and GaAs is the device containing layer), (3) $Si/Ga_{1-x}B_xAs(graded)/GaAs$, where x is a variable in the range from 0.27 to 0.002 (in this notation Si is the substrate, $Ga_{1-x}B_xAs$ is the intermediate layer and GaAs is the device containing layer); to provide a graded $Ga_{1-x}B_xAs$ layer between the Si substrate and GaAs layer, x has a large value at the top of the range in the portion of the intermediate layer adjacent the silicon substrate and a value at the bottom of the range adjacent the GaAs layer, (4) $Si/(Ga_{1-x}B_xAs/GaAs)_n/GaAs$, where n is an integer representing the number of super-lattice cycles of the $(Ga_{1-x}B_xAs/GaAs)$ layers, (5) $Si/Ge/Ga_{1-x}B_xAs/GaAs$, where x is a fixed value in the range from 0.01 to 0.05, (6) $Si/Si_{1-y}Ge_y/Ga_{1-x}B_xAs/GaAs$, where y is a variable from slightly more than 0 to 1 such that y is about zero for the portion of the $Si_{1-y}Ge_y$ layer abutting against the Si substrate and y is about 1 for the portion of the $Si_{1-x}Ge_y$ layer abutting against the $Ga_{1-x}B_xAs$ layer, and x is a fixed value in the range from 0.01 to 0.05.

In the foregoing examples, it is possible to replace, in each instance, $Ga_{1-x}B_xAs$ by $GaAs_{1-z}N_z$ and to have the values of z in the same range as the values of x. Where chemical vapor deposition is used to form heteroepitaxial devices, the substrates may be Si, $Si_x Ge_{1-x}$ (graded) (where x is a variable from one to zero), Ge or $Al_2O_3$ (i.e., sapphire). The advantages of these heteroepitaxial devices are large, low-cost substrates in the case of silicon, better lattice match for $Si/Si_xGe_{1-x}$ and Ge, and better thermal expansion match for dielectric $Al_2O_3$ substrates.

While there have been described and illustrated several specific embodiments of the invention, it will be clear that variations in the details of the embodiments specifically illustrated and described may be made without departing from the true spirit and scope of the invention as defined in the appended claims.

What is claimed is:

1. A low dislocation density semiconductor structure comprising a non-metallic substrate having the usual dislocation density for the material of the substrate, a first epitaxial layer of a III-V or II-VI semiconductor compound carried by the substrate, the compound being alloyed with atoms of a type and quantity to cause the first epitaxial layer to be formed with a low dislocation density relative to the dislocation density the first epitaxial layer would have if it were not alloyed with the alloying atoms, the number of alloying atoms being such that the alloying atoms are supersaturated in the III-V or II-VI semiconductor compound of the first epitaxial layer, a second epitaxial layer overlaying the first epitaxial layer and consisting of the III-V or II-VI compound of the first layer without the alloying atoms, the second layer having approximately the same lattice constant and dislocation density as the formed low dislocation density first layer.

2. The structure of claim 1 wherein the substrate consists essentially of the III-V or II-VI compound.

3. The structure of claim 2 wherein the substrate consists essentially of GaAs.

4. The structure of claim 3 wherein the GaAs compound of the first layer is alloyed with N to form the first layer as $GaN_yAs_{1-y}$, where y is a value causing N to be supersaturated in GaAs.

5. The structure of claim 3 wherein the GaAs compound of the first layer is alloyed with B to form the first layer as $Ga_{1-x}B_xAs$, where x is a value causing B to be supersaturated in GaAs.

6. The structure of claim 5 wherein $0.01 \leq x \leq 0.05$ and $0.005 \leq y \leq 0.05$.

7. The structure of claim 1 wherein the substrate consists essentially of a semiconductor from column IV of the periodic chart.

8. The structure of claim 1 wherein the substrate consists essentially of silicon.

9. The structure of claim 8 wherein $0.01 \leq x \leq 0.05$.

10. The structure of claim 9 where $0.005 \leq y \leq 0.05$.

11. The structure of claim 8 wherein the first and second layers consist essentially of $Ga_{1-x}B_xAs$ and GaAs, respectively, where $0.0009 \leq x \leq 0.3$.

12. The structure of claim 8 wherein the first and second layers consist essentially of $GaN_yAs_{1-y}$ and GaAs, respectively, where y has a value causing N to be supersaturated in GaAs.

13. The structure of 8 further including lattice matching layer means between the first layer and the substrate.

14. The structure of claim 1 wherein the substrate and first layer have different lattice constants, and further including lattice matching layer means sandwiched between the substrate and first layer.

15. The structure of claim 14 wherein the layer means includes a superlattice layer structure.

16. The structure of claim 15 wherein the superlattice structure consists of $$GaN_yAs_{1-y}/GaAs$$

where $0 < y < 0.3$ and n is an integer greater than 1 equal to the number of $GaN_{1-y}As/GAAs$ cycles of the superlattice structure.

17. The structure of claim 15 wherein the supperlattice structure consists of $$(Ga_{1-x}B_xAs/GaAs)_n$$

where $0<x<0.3$ and n is an integer greater than 1 equal to the number of $Ga_{1-x}B_xAs/GaAs$ cycles of the superlattice structure.

18. The structure of claim 17 wherein the substrate consists essentially of Si.

19. The structure of claim 14 wherein the layer means includes a graded layer.

20. The structure of claim 19 wherein the graded layer consists of essentially $Ga_{1-y}B_yAs$, where y is graded from 0.27 to 0.002 and the substrate consists essentially of Si and the second layer consists of essentially GaAs.

21. The structure of claim 19 wherein the graded layer consists of essentially $Si_{1-y}Ge_y$, where the substrate consists of essentially Si and the first layer consists of essentially $Ga_{1-x}B_xAs$, where $0.0009<x<0.3$, and $0<y\leq 1$.

22. The structure of claim 14 wherein the layer means includes a layer of a single constituent.

23. The structure of claim 22 wherein the substrate consists of essentially Si, the layer means consists of essentially Ge, and the first layer consists of essentially $Ga_{1-x}B_xAs$, where $0.0009<x<0.3$.

24. The structure of claim 1 wherein the substrate consists essentially of germanium.

25. The structure of claim 1 wherein the substrate consists essentially of a metal oxide dielectric.

26. The structure of claim 25 wherein the metal oxide dielectric is sapphire.

27. The structure of claim 1 further including multiple, active semiconductor devices formed on said second layer.

28. The structure of claim 1 wherein the number of alloying atoms is such that the alloying atoms are not precipitated from the first layer.

29. A low dislocation density semiconductor structure comprising a non-metallic substrate having the usual dislocation density for the material of the substrate, a first region of a III-V or II-VI semiconductor compound carried by the substrate, the compound being alloyed with atoms of a type and quantity to cause the first region to be formed with a low dislocation density relative to the dislocation density the first region would have if it were not alloyed with the alloying atoms, the number of alloying atoms being such that the alloying atoms are supersaturated in the III-V or II-VI semiconductor compound of the first region, a second region overlaying the first region, the second region consisting of the II-V or II-VI compound of the first region without the alloying atoms, the second region having approximately the same lattice constant and dislocation density as the formed low dislocation density first region.

* * * * *